US006296169B1

United States Patent
Ong

(12) United States Patent
(10) Patent No.: US 6,296,169 B1
(45) Date of Patent: Oct. 2, 2001

(54) FLUX-APPLICATION FIXTURE FOR A BALL-GRID-ARRAY (BGA) ASSEMBLY PROCESS

(75) Inventor: E. C. Ong, Sunnyvale, CA (US)

(73) Assignee: Advanced Interconnect Solutions, Sunnyvale, CA (US)

(*) Notice: Subject to any disclaimer, the term of this patent is extended or adjusted under 35 U.S.C. 154(b) by 0 days.

(21) Appl. No.: 09/589,640

(22) Filed: Jun. 7, 2000

(51) Int. Cl.[7] ............................................ B23K 1/20
(52) U.S. Cl. ............................ 228/36; 228/33; 228/207
(58) Field of Search ............................... 228/33, 36, 207, 228/214, 246; 218/388; 427/256, 126.1, 207.1

(56) References Cited

U.S. PATENT DOCUMENTS

| | | | |
|---|---|---|---|
| 5,186,982 | * 2/1993 | Blette et al. | 427/256 |
| 5,435,481 | * 7/1995 | Da Costa Alves et al. | 228/223 |
| 5,477,419 | * 12/1995 | Goodman et al. | 361/760 |
| 5,676,305 | * 10/1997 | Potter et al. | 228/207 |
| 5,695,667 | * 12/1997 | Eguchi | 219/388 |
| 5,816,481 | * 10/1998 | Economy et al. | 228/207 |
| 5,834,062 | * 10/1998 | Johnson et al. | 427/256 |
| 6,013,899 | * 1/2000 | Eguchi et al. | 219/388 |
| 6,056,190 | * 5/2000 | Foulke et al. | 228/246 |

* cited by examiner

*Primary Examiner*—Tom Dunn
*Assistant Examiner*—Colleen P. Cooke
(74) *Attorney, Agent, or Firm*—Donald R Boys; Central Coast Patent Agency, Inc.

(57) ABSTRACT

A flux-application fixture for applying flux to die pads in a ball-grid-array assembly process is provided. The fixture comprises a solid plate having a lower surface and an upper surface and a plurality of flux pins formed in the upper surface of the solid plate. The flux pins are contiguous with the solid plate and are formed by removing material from the upper surface of the plate such that the remaining material not removed forms the plurality of flux pins. In a preferred application the material is removed by grinding and the flux plate is ground flat to tight tolerance before removing the material to form the flux pins.

4 Claims, 2 Drawing Sheets

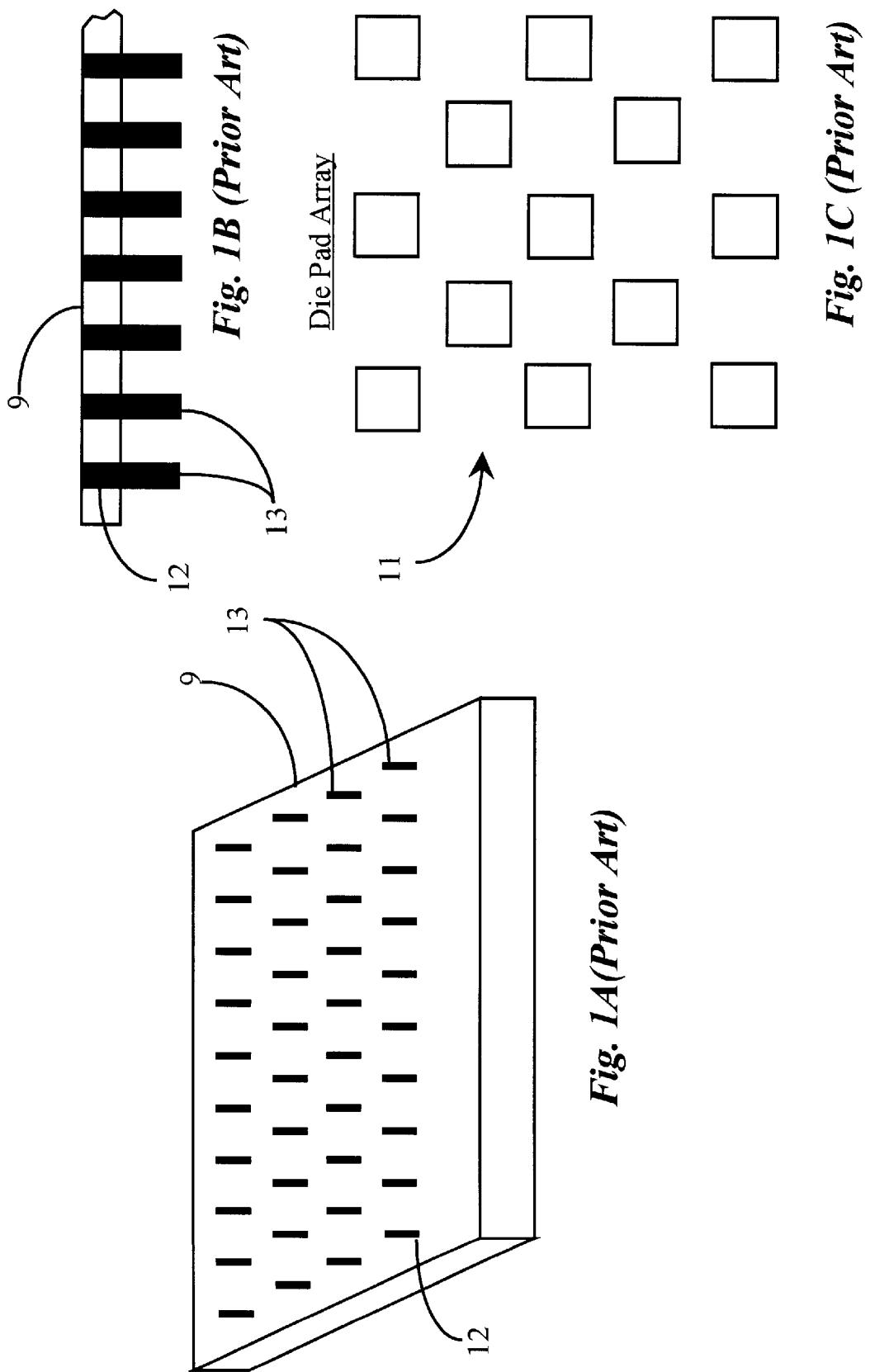

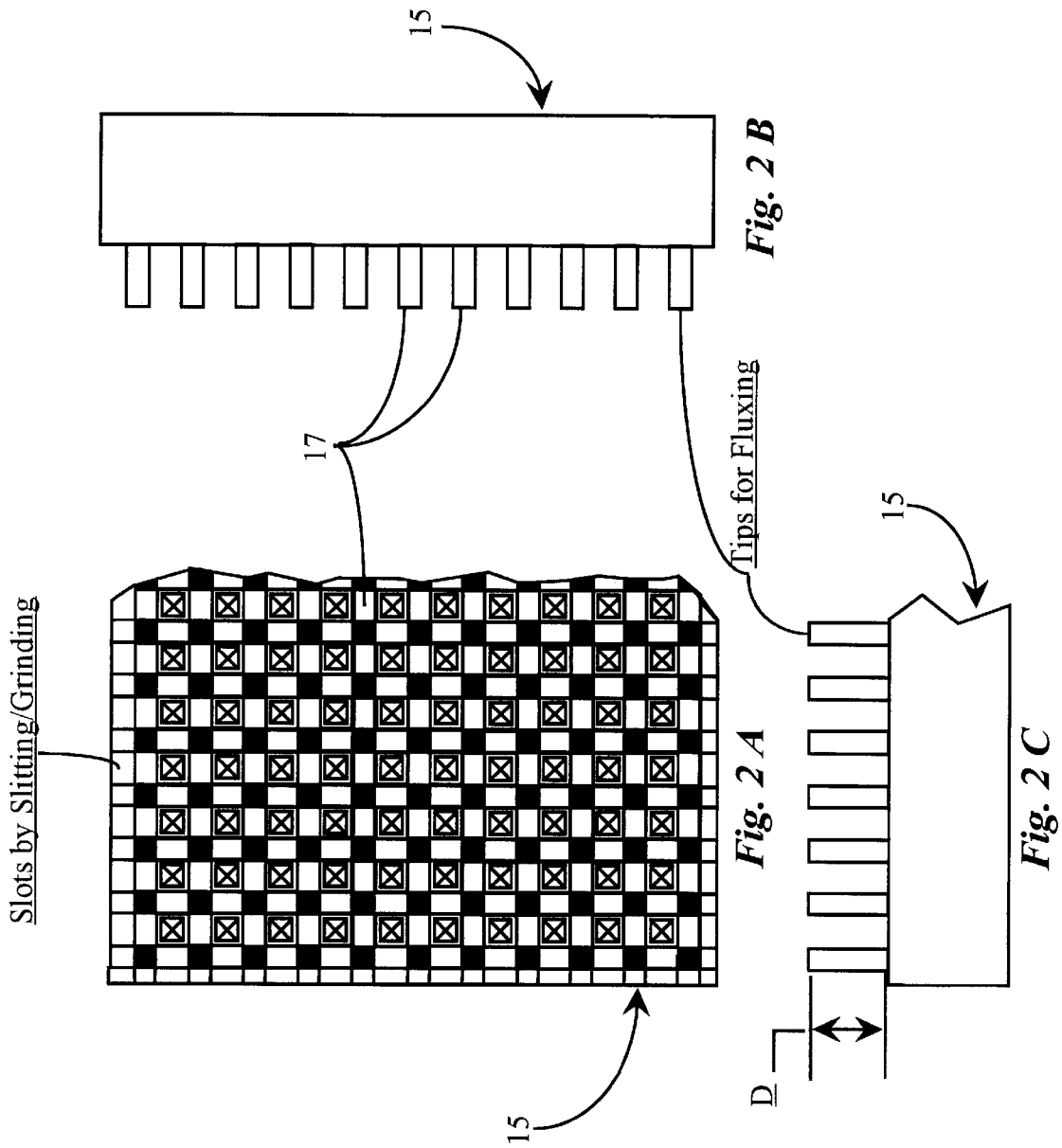

FLUX-APPLICATION FIXTURE FOR A BALL-GRID-ARRAY (BGA) ASSEMBLY PROCESS

FIELD OF THE INVENTION

The present invention is in the field of semiconductor manufacturing including surface mount technologies (SMT), and pertains more particularly to apparatus for placing solder flux on an array of die pads on a substrate in preparation for BGA assembly.

BACKGROUND OF THE INVENTION

The field of integrated circuit packaging is one of the most evolutionary fields connected to semiconductor manufacturing. As demand for devices that are smaller and more powerful continues to increase, pressures are put on manufacturers to develop better and more efficient ways to assemble and package IC products. One of the more recently developed methods for assembling and packaging IC products is known as Ball-Grid-array (BGA) technology. Motorola™ inc. is one of the more noted pioneers of BGA technology. Currently there are many companies that license BGA technology developed by Motorola™.

BGA technology, which uses solder balls instead of interconnect leads, offers several advantages over more mainstream technologies such as Fine-Pitch-Technology (FTP), and Pin-Grid-Array (PGA). One obvious advantage is that there are no leads that can be damaged during handling. Another advantage is that the solder balls are self-centering on die pads. Still other advantages include smaller size, better thermal and electrical performances, better package yields, and so on.

In typical BGA assembly, an array of metallic die pads provided in a substrate or wafer is fluxed during a fluxing operation in preparation for insertion of individual solder balls one per pad. After the solder balls are placed into the array of pads, a next operation involving a heat process causes the solder balls to be soldered to the individual pads performing the connecting mechanisms for surface mounting.

The above-described fluxing operation conventionally involves the use of a plate having a specific array of openings placed therein for the purpose of retaining an identical array of same-length pins, which are mounted into the openings. The resulting fixture is then placed into a source of flux material and touched to the die-pad array thus transferring flux material to each individual die pad simultaneously. Generally speaking, the arrangement of openings and mounted pins specific to a flux fixture is identical to a specific arrangement of die pads on a given substrate.

Problems can accrue with respect to the method described above, specifically regarding the physical aspects of and vulnerability of the fluxing fixture itself. For example, it is a difficult process to ensure that all pins specific to a fixture are mounted such that they are protruding at a same length. If some pins are shorter than others in a complete fixture, then the associated die pads on a given substrate will not receive the proper amount of fluxing. In addition to length variances, perpendicularity variances with regard to individual pins and their positions of mounting within the provided openings of the flux plate cause the pin surfaces of the non-perpendicular pins to form a non-coplanar relationship with their associated die pads. This results in improper delivery of the flux material to the die pads. It is further noted that prior-art pins and openings are restricted by practicality to being round, which is another disadvantage in flux application.

What is clearly needed is a fluxing fixture that is formed of one-piece such that all of the pins are physically identical to each in cross-section and length and retain identical positions with respect to the surface of the fixture. A fixture such as this would streamline the fluxing operation in BGA assembly by providing a physically consistent interface between the surfaces of each pin and their associated die pads when transferring flux material.

SUMMARY OF THE INVENTION

In a preferred embodiment of the present invention a flux-application fixture for applying flux to die pads in a ball-gild-array assembly process is provided, comprising a solid plate having a lower surface and an upper surface; and a plurality of flux pins formed in the upper surface of the solid plate. The fixture is characterized in that the flux pins are contiguous with the solid plate and are formed by removing material from the upper surface of the plate such that the remaining material not removed forms the plurality of flux pins.

The material removed from the upper surface of plate is removed by a machine-directed grinding process in a preferred embodiment, wherein grooves are ground into the plate in an onthogonal arrangement. The material may be stainless steel, nickel-steel, or some other hardened alloy. Typically the flux pins in embodiments of the invention are rectangular in shape having upper surfaces that are rounded by virtue of smoothing the rectangular comers and edges.

In another aspect of the invention a method for manufacturing a flux-application fixture is provided, comprising steps of (a) placing a flat plate on a grinding machine having a grinding wheel for removing material from the plate; (b) removing material from the plate in a series of equally spaced and parallel grooves across the plate; (c) reorienting the plate on the grinding machine at a 90 degree rotation from the original orientation; and (d) removing material from the plate in a series of equally spaced and parallel grooves across the plate. Preferably the flat plate is of rectangular shape and is ground flat before removing material.

Now, for the first time, a fluxing fixture is provided, wherein all of the pins are physically identical to each other and retain identical positions with respect to the surface of the fixture. A fixture such as this streamlines the fluxing operation in BGA assembly and provides a physically consistent interface between the surfaces of each pin and their associated die pads when transferring flux material.

BRIEF DESCRIPTION OF THE DRAWING FIGURES

FIG. 1A is a perspective view of a fluxing fixture according to prior art.

FIG. 1B is a broken view of an array of pins mounted into the fluxing fixture of FIG. 1A.

FIG. 1C is a block representation illustrating a typical die-pad array for receiving flux through utilization of the fluxing fixture of FIG. 1A.

FIG. 2A is a broken view of a fluxing fixture according to an embodiment of the present invention.

FIG. 2B is a right-side view of the fluxing fixture of FIG. 2 A illustrating a pin array.

FIG. 2C is a bottom-side view of the fluxing fixture of 2A illustrating a pin array.

DESCRIPTION OF THE PREFERRED EMBODIMENTS

As previously described in the background section, prior-art fluxing fixtures or plates present physical as well as practical limitations associated with how they are constructed. Some of these limitations are described in the following prior art examples.

FIG. 1A is a perspective view of a fluxing fixture 9 according to prior art. Fluxing fixture 9 comprises a plate, which may be of steel or other durable material, having a plurality of openings 12 provided therein and adapted for retaining a like plurality of flux pins 13. Pins 13 may be pressed into openings 12 such that they are tightly fitted. In some cases pins 13 may be welded or otherwise affixed into openings 12.

Generally speaking, the exact array of openings provided in plate 9 would logically replicate a like array of die pads arranged on a given substrate. Therefore, it may be assumed that fixture 9 would be used with specific substrates having specific geometry of die-pad arrays. In order to facilitate successful fluxing, pins 13 must be mounted within openings 12 such that they are of a same length of protrusion from the surface of plate 9. Moreover, each pin 13 must be parallel to other pins in plate 9, as well as perpendicular to the mounting surface of plate 9.

FIG. 1B is a sectioned view of an array of pins 13 mounted into fluxing fixture 9 of FIG. 1A. As can be seen in this example, pins 13 are arranged in parallel formation to each other. Pins 13 are of the same length and are seated at the same depth within plate 9. One problem described in the background section relates to the difficulty of manufacturing a fluxing fixture wherein all of the pins retain dimensional consistence with one another. For example, all of openings 12 must be machined identically with regard to diameter and depth. Similarly, each opening 12 must be placed perpendicularly into the mounting surface of plate 9. One with skill in the art will appreciate the complexity and the difficulty involved in achieving a high quality fixture. Given a fixture 9 wherein all openings 12 are identical in physical dimension and depth, still pins 13 must be provided of a same length in order to be properly seated within openings 12.

Irregularities, such as variances in pin length, depth of openings, or mounted position of pins within the openings, cause irregularities with respect to the proper amount of flux delivered to die pads.

FIG. 1C is a block representation illustrating a typical die-pad array for receiving flux through utilization of the fluxing fixture of FIG. 1A. In this prior art example, the typical die pad array 11 illustrates the nature of placement of individual dies on a given substrate. In this case, there are nine die pads arranged in a 3 by 3 rectangular pattern, and 4 die pads arranged in a rectangular pattern which is dimensionally offset from the pattern of 9 die pads. Referring now to FIG. 1 A., openings 12 must exhibit a pattern identical to those illustrated in FIG. 1C by die-pad array 11. In an example where there are a specific number of openings 12 placed in true positions matching the true positioning of each individual pad in array 11, then pins 13 may be provided and pressed into plate 9 at the true positions illustrated by the individual pads in array 1. The disadvantages associated with the complexity involved in manufacturing flux plate 9 outweigh any advantage of being able to use one flux plate for a variety of patterns given in a die array particular to a substrate. Furthermore, the fragility of flux plate 9 by virtue of mounted pins 13 is acute, lending to a high possibility of damage by dropping flux plate 9 during operation, or by banging and other component or two into flux plate 9 during setup. If one were to inadvertently drop any moderately sized object on to flux plate 9, more specifically, on to pins 13, flux plate 9 would be damaged, and would have to be reworked or discarded.

As a solution to the limitations described above regarding flux plate 9 in the prior art example, the inventor provides a novel flux plate machined as one element and adapted to provide flux evenly and in a proper amount to an array of die pads on a substrate.

FIG. 2A is a plan view of a portion of a fluxing fixture 15 according to an embodiment of the present invention. Fluxing fixture 15 is, in a preferred embodiment, manufactured in one piece of a single durable material such as a stainless steel. In other embodiments, other materials may be used as long as such materials are durable and retain their intended physical characteristics after manufacture. Fluxing fixture 15 comprises a plate that has been processed in a grinding operation adapted to remove material from the surface of flux plate 15 in order to form a plurality of rectangular pins arranged in an array dictated by the direction of grinding. For example, plate 15 is first ground in parallel, equally-spaced rows extending the length of the plate. Then plate 15 is rotated by 90 degrees and ground in the same manner as described above. The result is a plurality of rectangular pins, represented herein by pins 17, arranged in equally spaced and in true positions to one another.

FIG. 2B is a right-side view of fluxing fixture 15 of FIG. 2A illustrating the array of pins 17. As can be seen in this view, pins 17 are rectangular in profile and shape. The top surfaces of pins 17 exhibit a typical sharp-edged profile of a rectangular pin after grinding. A sandblasting operation, or other deburring technique may be used to soften the sharp edges. In this way, flux material may be transferred in a more appropriate fashion. By virtue of a fact that the grinding operation produces rectangular pins, a preferred state exists with respect to the surface edges of pins 17 in that they are similar to the shape of the pads themselves and are therefore of a more appropriate shape for transferring flux to rectangular pads. Also, by virtue of the fact that plate 15 is ground flat according to very strict tolerances before removing material to create the pins, pins 17 are ensured a consistent and same length thereby providing a reliable flux-transfer interface.

FIG. 2C is a bottom-side view of fluxing fixture 15 of 2A illustrating the array of pins 17. In this view, a height D is illustrated as a distance of extension of pins 17 from the upper surface of plate 15. In preferred embodiments, height D is approximately 30 to 50 mils in dimension. Considering optimum miniaturization states related to die processing in general, and more specifically, in BGA implementation wherein solder balls are of the order of microns and die pads are the few dozen mils square, the actual grinding operation required to produce pins 17 is at least as efficient if not more so than prior art provisioning of openings 12 in plate 9 described above. In addition to the above-stated advantages over prior art, pins 17 are much stronger by virtue of their rectangular shape than round pins 13 described in FIG. 1B above, and by virtue of being integral with the plate from which they are formed. In this way, flux fixture 15 may withstand much more adversity with respect to banging, dropping, dinging, etc. than prior art fixtures may withstand.

It will be apparent to one with skill in the art that the apparatus of the present invention provides a much more durable and reliable flux-transfer interface for BGA processing than would prior-art fixtures. The flux plate 15 may be ground according to specific dimensioning by providing a correct size of grinding wheel, and utilizing state-of-the-art grinding equipment. In some embodiments grinding wheels may also be shaped to impart beveled edges on the extended ends of the flux transfer pins formed.

It will be appreciated by the skilled artisan that the exemplary embodiments described above may be varied in considerable detail without departing from the spirit and scope of the invention. The spirit and scope of the present invention is limited only by the claims that follow.

What is claimed is:

1. A flux-application fixture for applying flux to die pads in a ball-grid-array assembly process comprising:
    a solid state plate having a lower surface and an upper surface; and
    a plurality of flux pins formed in the upper surface of the solid plate;
    characterized in that the flux pins and the plate are formed as one contiguous element from a single piece of durable material.

2. The flux-application fixture of claim 1, wherein the material forming the plate and the pins is stainless steel.

3. The flux-application fixture of claim 1, wherein the material forming the plate and the pins is a composite of nickel and steel.

4. The flux-application fixture of claim 1, wherein the flux pins are rectangular in shape having upper surfaces, and corners and edges of the rectangular shape of the pins are rounded by virtue of smoothing the corners and edges of the rectangular shaped pins.

* * * * *